US012093190B2

(12) United States Patent
Ashino et al.

(10) Patent No.: US 12,093,190 B2
(45) Date of Patent: Sep. 17, 2024

(54) RECORDATION OF DATA IN ACCORDANCE WITH DATA COMPRESSION METHOD AND COUNTING READING OF THE DATA IN ACCORDANCE WITH DATA COUNTING METHOD

(71) Applicant: NEC Corporation, Tokyo (JP)

(72) Inventors: Yuki Ashino, Tokyo (JP); Kazushi Sugyo, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/768,101

(22) PCT Filed: Nov. 5, 2020

(86) PCT No.: PCT/JP2020/041307
§ 371 (c)(1),
(2) Date: Apr. 11, 2022

(87) PCT Pub. No.: WO2021/090866
PCT Pub. Date: May 14, 2021

(65) Prior Publication Data
US 2024/0086334 A1 Mar. 14, 2024

(30) Foreign Application Priority Data
Nov. 8, 2019 (JP) .................................. 2019-203032

(51) Int. Cl.
*G06F 12/14* (2006.01)
*G06F 16/174* (2019.01)
*H04L 69/04* (2022.01)

(52) U.S. Cl.
CPC .............. *G06F 12/14* (2013.01); *H04L 69/04* (2013.01); *G06F 16/1744* (2019.01);
(Continued)

(58) Field of Classification Search
None
See application file for complete search history.

(56) References Cited

U.S. PATENT DOCUMENTS 6,348,881 B1 * 2/2002 Buer .................... H03M 7/3084
375/240
7,079,051 B2 * 7/2006 Storer ..................... H03M 7/30
341/51
(Continued)

FOREIGN PATENT DOCUMENTS

| JP | H08-46911 A | 2/1996 |
| JP | H10-75370 A | 3/1998 |

(Continued)

OTHER PUBLICATIONS

Takahashi, "Log Analysis Device, Log Analysis Method, and Computer-Readable Recording Medium", WO/2019/043804, Mar. 7, 2019, English Translation, pp. 1-15 (Year: 2019).*

(Continued)

*Primary Examiner* — Christopher D Birkhimer (57) ABSTRACT

In order to record communication data via a communication network, in a storage apparatus in accordance with an appropriate data recording method, a data processing apparatus includes: an obtaining unit configured to obtain communication data including one or more packets continuously communicated via a communication network; a recording unit configured to record the communication data in a storage; and a reading processing unit configured to read the communication data from the storage, wherein the recording unit selects a first data compression method from among a plurality of data compression methods based on compression rate for each data compression method, reading speed of the communication data from the storage, and decompression speed of the communication data required from reading of the communication data to decompression of the (Continued)

communication data in accordance with each compression method, and records the communication data in accordance with the first data compression method.

10 Claims, 9 Drawing Sheets

(52) U.S. Cl.
CPC ............... *G06F 2212/1052* (2013.01); *G06F 2212/154* (2013.01); *G11C 2207/102* (2013.01)

(56) References Cited

U.S. PATENT DOCUMENTS

| | | | | |
|---|---|---|---|---|
| 8,732,403 | B1* | 5/2014 | Nayak | G06F 3/0619 |
| | | | | 711/170 |
| 9,715,434 | B1* | 7/2017 | Xu | G06F 3/067 |
| 10,108,543 | B1* | 10/2018 | Duggal | G06F 11/14 |
| 10,108,544 | B1* | 10/2018 | Duggal | G06F 11/14 |
| 10,664,165 | B1* | 5/2020 | Faibish | G06F 3/0638 |
| 10,795,812 | B1* | 10/2020 | Duggal | G06F 3/067 |
| 2008/0144079 | A1* | 6/2008 | Pandey | H03M 7/30 |
| | | | | 358/1.15 |
| 2010/0077013 | A1* | 3/2010 | Clements | G06F 16/1748 |
| | | | | 707/822 |
| 2010/0088296 | A1* | 4/2010 | Periyagaram | G06F 16/183 |
| | | | | 707/E17.014 |
| 2010/0125553 | A1* | 5/2010 | Huang | G06F 11/1453 |
| | | | | 707/661 |
| 2010/0174881 | A1* | 7/2010 | Anglin | G06F 11/1453 |
| | | | | 711/E12.103 |
| 2010/0281081 | A1* | 11/2010 | Stager | G06F 9/5022 |
| | | | | 707/814 |
| 2010/0333116 | A1* | 12/2010 | Prahlad | G06F 3/061 |
| | | | | 713/153 |
| 2013/0166861 | A1* | 6/2013 | Takano | G06F 3/064 |
| | | | | 711/161 |
| 2013/0332652 | A1 | 12/2013 | Hayashi | |
| 2014/0114932 | A1* | 4/2014 | Mallaiah | G06F 3/0641 |
| | | | | 707/E17.032 |
| 2014/0143517 | A1* | 5/2014 | Jin | G06F 12/023 |
| | | | | 711/171 |
| 2015/0205816 | A1* | 7/2015 | Periyagaram | G06F 11/1453 |
| | | | | 707/827 |
| 2015/0261776 | A1* | 9/2015 | Attarde | G06F 16/1748 |
| | | | | 707/664 |
| 2016/0350324 | A1* | 12/2016 | Wang | G06F 16/137 |
| 2017/0038978 | A1* | 2/2017 | Li | G06F 3/0611 |
| 2017/0235814 | A1* | 8/2017 | Branscome | G06F 16/24532 |
| | | | | 707/737 |
| 2017/0293563 | A1* | 10/2017 | DeHon | G06F 21/52 |
| 2017/0300422 | A1* | 10/2017 | Szubbocsev | G06F 12/1009 |
| 2018/0095674 | A1* | 4/2018 | Alameldeen | G06F 3/064 |
| 2018/0314727 | A1* | 11/2018 | Epstein | G06N 5/01 |
| 2019/0205035 | A1* | 7/2019 | Mizushima | G06F 12/04 |
| 2020/0159669 | A1* | 5/2020 | Duncan | G06F 12/1027 |
| 2020/0310686 | A1* | 10/2020 | Truong | G06F 3/061 |
| 2021/0036714 | A1* | 2/2021 | Martin | H03M 7/6064 |
| 2021/0374021 | A1* | 12/2021 | Santhakumar | G06F 3/0659 |

FOREIGN PATENT DOCUMENTS

| | | |
|---|---|---|
| WO | 2013/186828 A1 | 12/2013 |
| WO | 2018/087795 A1 | 5/2018 |
| WO | 2019/043804 A1 | 3/2019 |

OTHER PUBLICATIONS

International Search Report for PCT Application No. PCT/JP2020/041307, mailed on Jan. 26, 2021.
English translation of Written opinion for PCT Application No. PCT/JP2020/041307, mailed on Jan. 26, 2021.

* cited by examiner

| ID | COUNTING METHOD NAME | DESCRIPTION OF COUNTING PROCESSING |
|---|---|---|
| 1 | COUNT NUMBER OF PACKETS TRANSMITTED BY IP ADDRESS THAT TRANSMITS SYN PACKET TO 9999/TCP | FIRST COUNTING: COUNT IP ADDRESSES THAT TRANSMIT SYN PACKET FOR 9999/TCP<br><br>SECOND COUNTING: OUTPUT ALL PACKETS TRANSMITTED BY IP ADDRESSES OBTAINED IN FIRST COUNTING |
| 2 | COUNT NUMBER OF PACKETS PER ADDRESS, WHICH PACKETS ARE TRANSMITTED BY IP ADDRESS WITHIN RANGE OF PLUS AND MINUS 256 OF TRANSMITION SOURCE IP ADDRESS THAT ALSO ESTABLISHED CONNECTION OTHER THAN FOR 80/TCP AMONG TRANSMITION SOURCE IP ADDRESSES THAT ESTABLISHED 80/TCP CONNECTION | FIRST COUNTING: COUNT TRANSMITION SOURCE IPs THAT ESTABLISHED 80/TCP CONNECTION<br><br>SECOND COUNTING: COUNT TRANSMITION SOURCE IP ADDRESSES THAT ESTABLISHED CONNECTION OTHER THAN FOR 80/TCP AMONG IP ADDRESSES OBTAINED IN FIRST COUNTING<br><br>THIRD COUNTING: OUTPUT ALL PACKETS TRANSMITTED BY IP ADDRESS WITHIN RANGE OF PLUS AND MINUS 256 OF IP ADDRESS OBTAINED IN SECOND COUNTING |

RECORDATION OF DATA IN ACCORDANCE WITH DATA COMPRESSION METHOD AND COUNTING READING OF THE DATA IN ACCORDANCE WITH DATA COUNTING METHOD

This application is a National Stage Entry of PCT/JP2020/041307 filed on Nov. 5, 2020, which claims priority from Japanese Patent Application 2019-203032 filed on Nov. 8, 2019, the contents of all of which are incorporated herein by reference, in their entirety.

BACKGROUND

Technical Field

The present invention relates to a data processing apparatus, a data processing method, and a program for performing data processing related to communication data via a communication network.

Background Art

Most communication data that are received via communication networks and are recorded do not contain harmful data, such as malwares or viruses. However, among such communication data that are supposed to be not harmful, suspicious activities may be contained.

Attack intention communications corresponding to such suspicious activities are observable, but it is difficult to predict in advance what kind of locations will be targeted. This is because, in the condition of having a connection to a communication network, such as the Internet, an attack intention communication is received from a third party at an unexpected timing.

In one example, it is assumed that communication data that are sensed by one or more sensing apparatuses are aggregated in a single center apparatus and are analyzed for whether they are attack intention communications. In this case, the sensing apparatuses temporarily store the communication data in storage apparatuses before performing transmission processing to the center apparatus.

For example, Patent Literature 1 discloses a storage system that, in the condition in which specified data for a read request is not stored in a cache, obtains compressed specified data from a storage and returns it as a reply to the read request after decompressing the obtained compressed data.

CITATION LIST

Patent Literature

[PTL 1] WO 2013/186828

SUMMARY

Technical Problem

Unfortunately, the following problem can occur when assuming a case of using a relatively low performance terminal apparatus with a Random Access Memory (RAM) capacity, a low access speed storage, or the like, in other words, a powerless terminal apparatus, as a sensing apparatus for sensing communication data.

That is, such a sensing apparatus can take a long time to accumulate communication data in its internal storage apparatus or the like. As a result, this accumulating time can be longer than a time that is required to transfer data to a center apparatus, which inhibits appropriately aggregating data in the center apparatus.

An example object of the present invention is to provide to a data processing apparatus, a data processing method, and a program that enable recording communication data via a communication network, in accordance with an appropriate data recording method.

Solution to Problem

According to an aspect of the present invention, a data processing apparatus includes: an obtaining unit configured to obtain communication data including one or more packets continuously communicated via a communication network; a recording unit configured to record the communication data in a storage apparatus; and a decompression processing unit configured to read the communication data from the storage apparatus and decompress the communication data, wherein the recording unit is configured to select a first data compression method from among a plurality of data compression methods based on compression rate for each data compression method, reading speed of the communication data from the storage apparatus to the decompression processing unit, and decompression speed of the communication data required from reading of the communication data by the decompression processing unit to decompression in accordance with each compression method, and record the communication data in accordance with the first data compression method.

According to an aspect of the present invention, a data processing apparatus includes: obtaining communication data including one or more packets continuously communicated via a communication network; recording the communication data in a storage apparatus; and reading the communication data from the storage apparatus and decompress the communication data, wherein the recording of the communication data in the storage apparatus includes selecting a first data compression method from among a plurality of data compression methods based on compression rate for each data compression method, reading speed of the communication data from the storage apparatus to the decompression processing unit, and decompression speed of the communication data required from reading of the communication data by the decompression processing unit to decompression in accordance with each compression method, and recording the communication data in accordance with the first data compression method.

According to an aspect of the present invention, a program causes a processor to execute processing including: obtaining communication data including one or more packets continuously communicated via a communication network; recording the communication data in a storage apparatus; and reading the communication data from the storage apparatus and decompress the communication data, wherein the recording of the communication data in the storage apparatus includes selecting a first data compression method from among a plurality of data compression methods based on compression rate for each data compression method, reading speed of the communication data from the storage apparatus to the decompression processing unit, and decompression speed of the communication data required from reading of the communication data by the decompression processing unit to decompression in accordance with each compression method, and recording the communication data in accordance with the first data compression method.

Advantageous Effects of Invention

An aspect of the present invention enables recording communication data via a communication network, in a storage apparatus in accordance with an appropriate data recording method. Note that, according to the present invention, instead of or together with the above effects, other effects may be exerted.

DESCRIPTION OF THE EXAMPLE EMBODIMENTS

Hereafter, example embodiments of the present invention will be described in detail with reference to the accompanying drawings. Note that, in the Specification and drawings, elements to which similar descriptions are applicable are denoted by the same reference signs, and overlapping descriptions may hence be omitted.

Descriptions will be given in the following order.
1. Overview of Example Embodiments of Present Invention
2. Configuration of System 1
3. First Example Embodiment
   3.1. Configuration of Data Processing Apparatus 100
   3.2. Operation Example
4. Second Example Embodiment
   4.1. Configuration of Data Processing Apparatus 100
   4.2. Operation Example
5. Third Example Embodiment
   5.1. Configuration of Data Processing Apparatus 100
   5.2. Operation Example
6. Other Example Embodiments 1. Overview of Example Embodiments of Present Invention First, an overview of example embodiments of the present invention will be described.

(1) Technical Issue

Most communication data that are received via communication networks and are recorded do not contain harmful data, such as malwares or viruses. However, among such communication data that are supposed to be not harmful, suspicious activities may be contained.

Attack intention communications corresponding to such suspicious activities are observable, but it is difficult to predict in advance what kind of locations will be targeted. This is because, in the condition of having a connection to a communication network, such as the Internet, an attack intention communication is received from a third party at an unexpected timing.

In one example, it is assumed that communication data that are sensed by one or more sensing apparatuses are aggregated in a single center apparatus and are analyzed for whether they are attack intention communications. In this case, the sensing apparatuses temporarily store the communication data in storage apparatuses before performing transmission processing to the center apparatus.

Unfortunately, the following problem can occur when assuming a case of using a relatively low performance terminal apparatus with a Random Access Memory (RAM) capacity, a low access speed storage, or the like, in other words, a powerless terminal apparatus, as a sensing apparatus for sensing communication data.

That is, such a sensing apparatus can take a long time to accumulate communication data in its internal storage apparatus or the like. As a result, this accumulating time can be longer than a time that is required to transfer data to a center apparatus, which inhibits appropriately aggregating data in the center apparatus.

Specifically, the data reading speed of initial reading of data from a storage apparatus depends on the reading speed of the storage apparatus. A terminal apparatus with relatively low performance generally has a cache memory having a small data size and thus hardly caches a large amount of data in a main memory or the like. As a result, as described above, it takes a long time to accumulate communication data in a storage apparatus or the like.

In view of this, an example object of the example embodiments is to record communication data via a communication network, in a storage apparatus in accordance with an appropriate data recording method.

(2) Technical Features

The example embodiments of the present invention include obtaining communication data including one or more packets continuously communicated via a communication network, recording the communication data in a storage apparatus, and reading the communication data from the storage apparatus. Here, when recording the communication data in the storage apparatus, a first data compression method is selected from among a plurality of data compression methods based on compression rate for each data compression method, reading speed of the communication data from the storage apparatus, and decompression speed of the communication data required from reading of the communication data to decompression of the communication data in accordance with each compression method, and the communication data is recorded in accordance with the first data compression method.

This enables recording, for example, communication data via a communication network, in a storage apparatus in accordance with an appropriate data recording method. Note that the above-described technical features are specific examples of the example embodiments of the present invention, and of course, the example embodiments of the present invention are not limited to the above-described technical features.

2. Configuration of System 1

Figure 1:
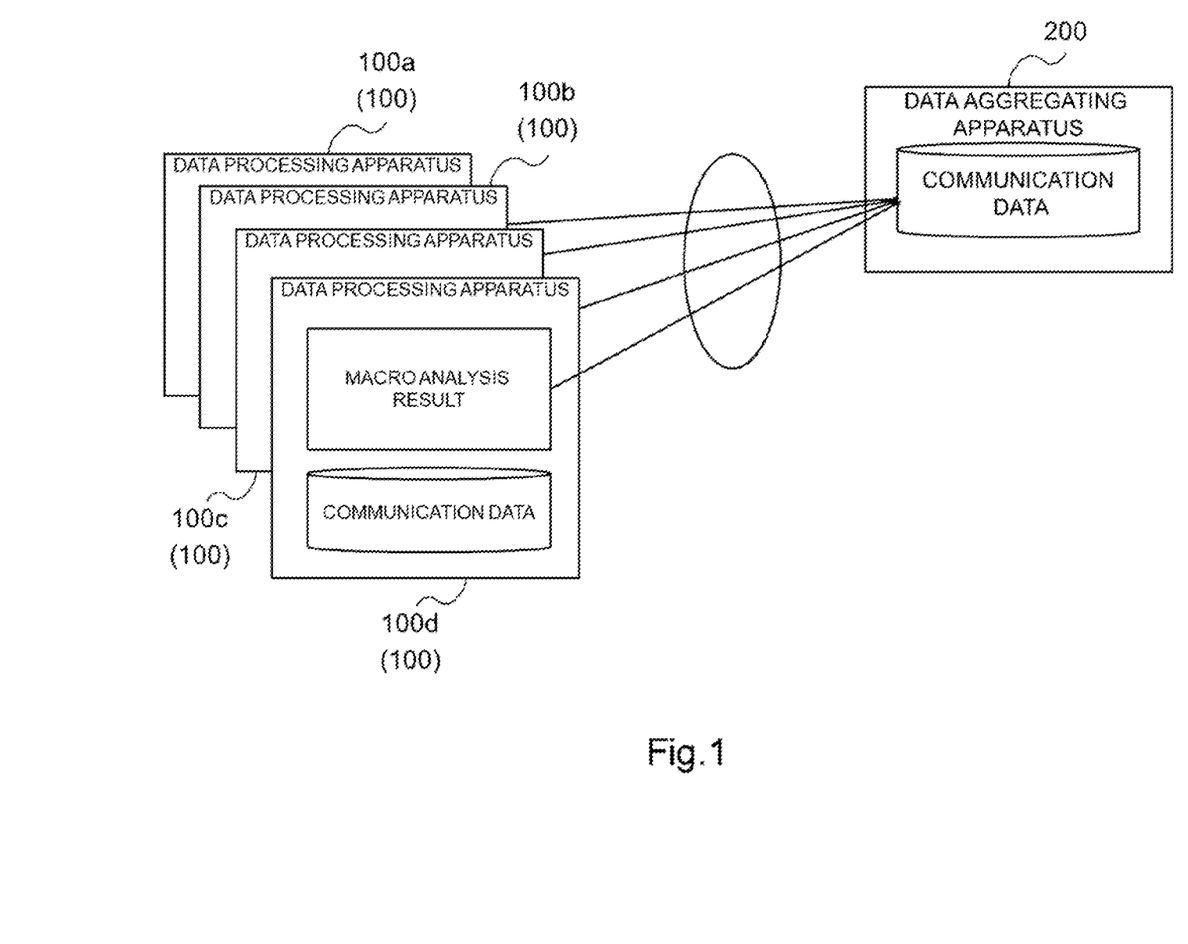
FIG. 1 is a diagram illustrating a schematic configuration of a system 1.

FIG. 1 is a diagram illustrating a schematic configuration of a system 1. With reference to FIG. 1, the system 1 includes a plurality of data processing apparatuses 100a to 100d (which are collectively simply called "data processing apparatuses 100") and a data aggregating apparatus 200.

In the system 1 having the configuration as described above, communication data via a communication network, such as the Internet or a local network, is sensed by each data processing apparatus 100. The communication data is then subjected to macro analysis, such as counting processing, and the communication data that is filtered based on the macro analysis result is transmitted from each data processing apparatus 100 to the data aggregating apparatus 200.

Thus, in the system 1, information related to the communication data is aggregated in the data aggregating apparatus 200, and the communication data is subjected to micro analysis, such as in-packet analysis.

3. First Example Embodiment

Next, a description will be given of a first example embodiment using the present invention with reference to FIGS. 2 to 6.

3.1. Configuration of Data Processing Apparatus 100

Figure 2:
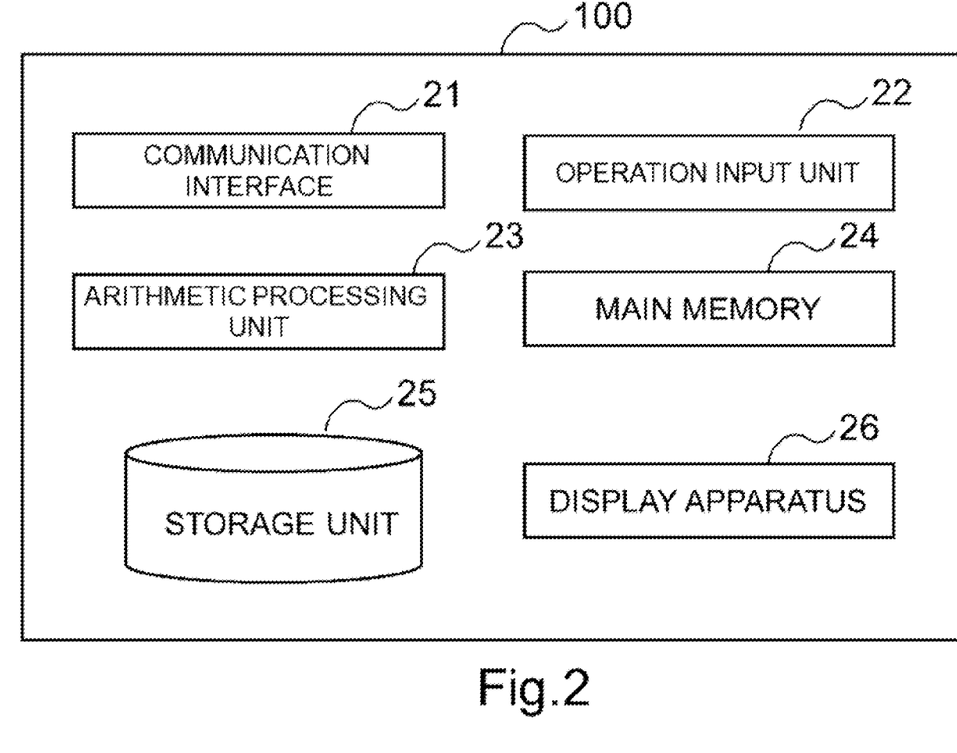
FIG. 2 is a block diagram illustrating an example of a hardware configuration of a data processing apparatus 100 according to a first example embodiment.

FIG. 2 is a block diagram illustrating an example of a hardware configuration of a data processing apparatus 100 according to the first example embodiment. With reference to FIG. 2, the data processing apparatus 100 includes a communication interface 21, an operation input unit 22, an arithmetic processing unit 23, a main memory 24, a storage unit 25, and a display apparatus 26.

The communication interface 21 transmits and receives data with an external apparatus. For example, the communication interface 21 communicates with an external apparatus via a wired communication path.

The operation input unit 22 is an input interface that performs input processing of an operation request from a user operating the data processing apparatus 100.

The arithmetic processing unit 23 is, for example, a Central Processing Unit (CPU) or a Graphics Processing Unit (GPU). The main memory 24 is, for example, a Random Access Memory (RAM) or a Read Only Memory (ROM). The storage unit 25 is, for example, a Hard Disk Drive (HDD), a Solid State Drive (SSD), or a memory card. The storage unit 25 may be a memory, such as a RAM or a ROM.

The display apparatus 26 is an apparatus that displays a screen corresponding to drawing data processed by the arithmetic processing unit 23, such as a Liquid Crystal Display (LCD), a Cathode Ray Tube (CRT) display, or a monitor.

Figure 3:
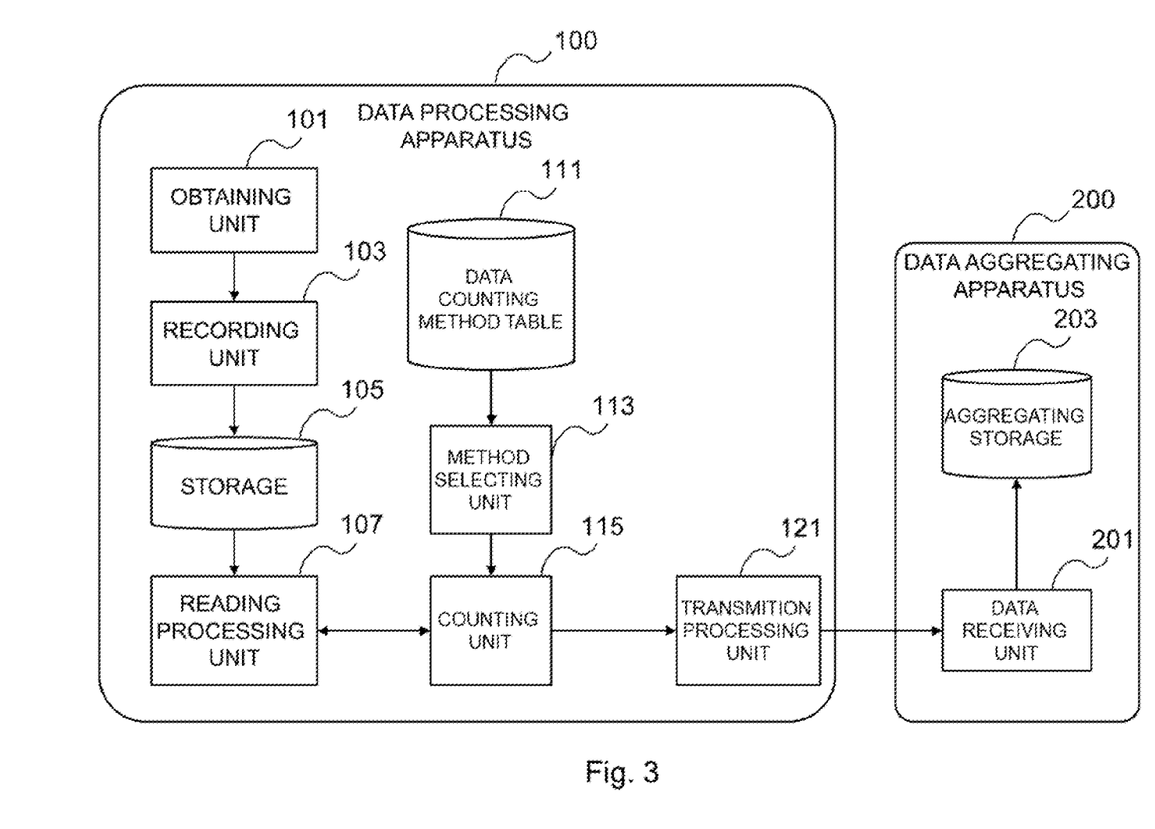
FIG. 3 is a block diagram illustrating an example of a functional configuration implemented by the data processing apparatus 100 and a data aggregating apparatus 200.

The data processing apparatus 100 reads out, for example, data processing programs stored in the storage unit 25 to the main memory 24 and the arithmetic processing unit 23 executes the programs, whereby functional units as illustrated in FIG. 3 are implemented. These programs may be executed after being read out to the main memory 24 or may be executed without being read out to the main memory 24. The main memory 24 and the storage unit 25 also store information and data that are stored by constituent elements of the data processing apparatus 100.

The above-described programs can be stored by using various types of non-transitory computer readable media (non-transitory computer readable medium) and can be provided to the computer. The non-transitory computer readable medium includes various types of tangible storage medium. Examples of the non-transitory computer readable medium include magnetic recording media (e.g., a flexible disk, a magnetic tape, and a hard disk drive), optical magnetic recording media (e.g., a magneto-optical disc), a Compact Disc-ROM (CD-ROM), a CR-Recordable (CD-R), a CR-ReWritable (CD-R/W), semiconductor memories (such as a mask ROM, a PROM (Programmable ROM), an Erasable PROM (EPROM), a flash ROM, and a RAM. The programs may be provided to the computer by various types of transitory computer readable medium. Examples of the transitory computer readable medium include electric signals, optical signals, and electromagnetic waves. The transitory computer readable medium can provide the programs to the computer via a wired communication path, such as a cable or an optical fiber, or a wireless communication path.

FIG. 3 is a block diagram illustrating an example of a functional configuration implemented by the data processing apparatus 100 and a data aggregating apparatus 200.

With reference to FIG. 3, the data processing apparatus 100 includes an obtaining unit 101, a recording unit 103, a storage 105, a reading processing unit 107, a data counting method table 111, a method selecting unit 113, a counting unit 115, and a transmission processing unit 121. Specific operation or processing of each of these functional units will be described later.

The data aggregating apparatus 200 includes a data receiving unit 201 and an aggregating storage 203. Specific operation or processing of each of these functional units will be described later.

3.2. Operation Example

Next, an example of operation of the first example embodiment will be described.

In the first example embodiment, the data processing apparatus 100 (obtaining unit 101) obtains communication data including one or more packets continuously communicated via a communication network. The data processing apparatus 100 (recording unit 103) records the communication data in the storage 105. The data processing apparatus 100 (reading processing unit 107) reads the communication data from the storage 105.

Here, the data processing apparatus 100 (recording unit 103) selects a first data compression method from among a plurality of data compression methods based on compression rate for each data compression method, reading speed of the communication data from the storage 105 to the reading processing unit 107, and decompression speed of the communication data required from reading of the communication data to decompression of the communication data in accordance with each compression method by the reading processing unit 107, and records the communication data in accordance with the first data compression method.

(1) Communication Data

The communication data is, for example, PCAP data containing a Packet Capture (PCAP) header and a PCAP payload.

Figure 4:
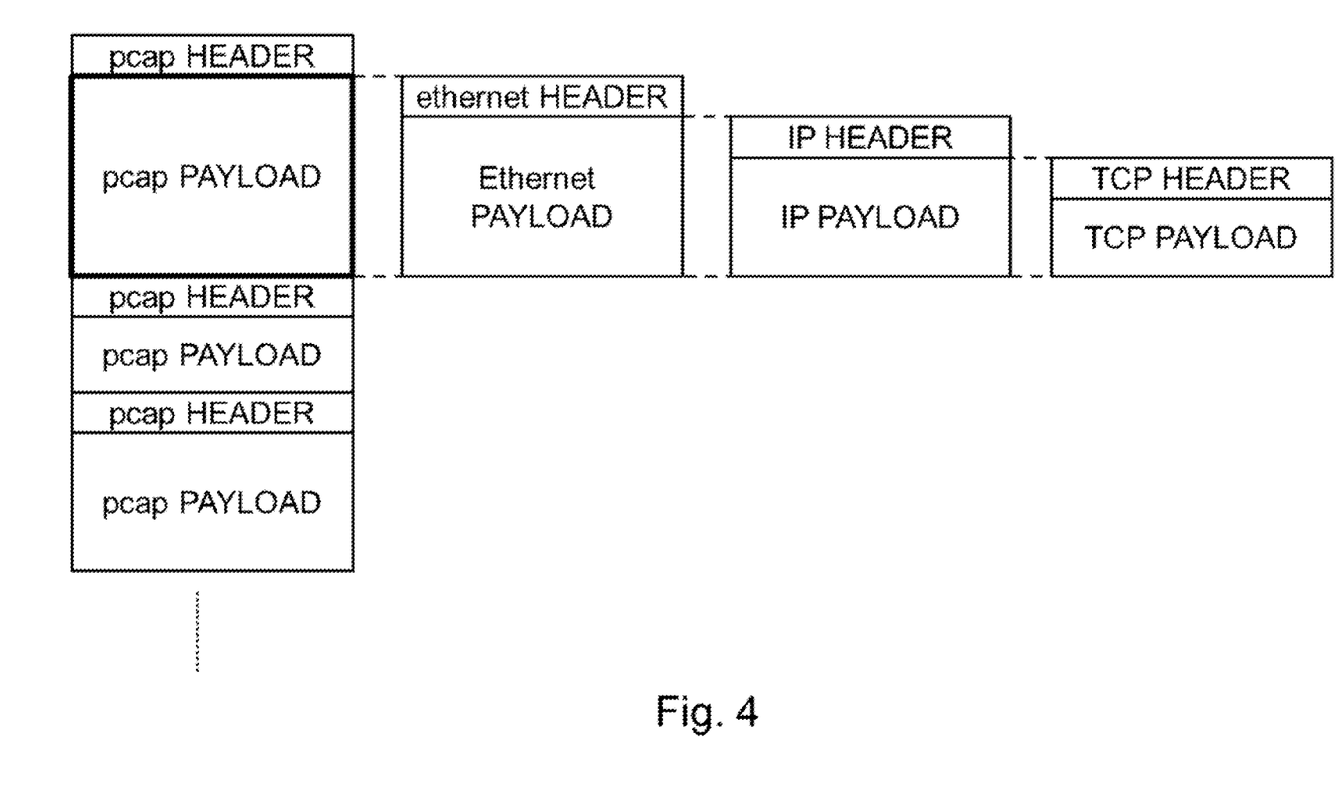
FIG. 4 is a diagram schematically illustrating a data structure of PCAP data.

FIG. 4 is a diagram schematically illustrating a data structure of PCAP data. With reference to FIG. 4, a PCAP header does not contain data for referring to other PCAP data. PCAP data can have a data size in the order of GB to TB. Such PCAP data are counted by the counting unit 115 in accordance with the data counting method as described later.

The data processing apparatus 100 (obtaining unit 101) is not limited to a configuration passively receiving the communication data from another network node via a communication network. Specifically, for example, the data processing apparatus 100 (obtaining unit 101) may actively access a communication network to receive the communication data from another network node via the communication network. This active acquisition of the communication data enables more effective data analysis.

(2) Recording of Communication Data

The data processing apparatus 100 (recording unit 103) records the communication data in the storage 105 without configuring index information that indicates a correspondence relationship between each data element contained in the communication data and a recording location in the storage 105.

In the case of the example illustrated in FIG. 4, for example, each PCAP data is recorded in the storage 105 without configuring an index indicating a correspondence relationship between identification information of a PCAP header of each PCAP data and location information in a storage region where each PCAP data is recorded in the storage 105.

(3) Data Compression Methods

The plurality of data compression methods include mutually different data compression methods. In other words, the data processing apparatus 100 (recording unit 103) selects an appropriate data compression method based on the reading speed of the communication data and the decompression speed of the communication data, as the first data compression method, from among a plurality of data recording methods including mutually different data compression methods.

Specifically, the plurality of data compression methods include, for example, the zip method, the gzip method, the Zstandard (Zstd) method, and the seven z (7z) method. Note that the plurality of data compression methods are not limited to these data compression methods and may include other data compression methods.

Compression Speed and Decompression Speed

The compression speed of each of the plurality of data compression methods greatly varies depending on the compression rate implemented by a corresponding compression algorithm, data characteristics (such as entropy), and so on. For example, when data having such low entropy that the compression rate can be high (e.g., data of continuous 0X00) is compressed, a high processing speed is achieved; on the other hand, compressing random data takes a long time for such processing, whereby the compressing speed is low. Similarly, the decompression speed of each of the plurality of data compression methods also greatly varies depending on the compression rate implemented by a corresponding compression algorithm, data characteristics (such as entropy), and so on.

Thus, for example, some pieces of data contained in the communication data are used as targets for measuring compression speed and are subjected to compression processing. This provides compression speed of each of the plurality of data compression methods. In a similar manner, for example, some pieces of data contained in the communication data are used as targets for measuring decompression speed and are subjected to decompression processing. This provides decompression speed of each of the plurality of data compression methods.

First Data Compression Method

Specifically, the first data compression method is a data compression method that satisfies the condition that the decompression speed of the communication data is higher than the reading speed of the communication data. In one example in which the reading speed of the communication data is 37.5 MB/s, the decompression speed of data that is compressed based on the first data compression method is higher than 37.5 MB/s.

Here, it is assumed that communication data that is compressed at a compression rate of 1/5 by using the gzip compression method as the first data compression method is decompressed at a speed of 150 MB/s. In this case, a substantially equivalent relationship is established between reading communication data at a speed of 37.5 MB/s from the storage 105 and reading communication data at a speed of 150 MB/s from the storage 105, as described by the following specific example.

In a specific example, as to processing of reading communication data of 30 MB that is compressed based on the gzip compression, reading the compressed communication data to the reading processing unit 107 takes 0.8 seconds, and decompressing the compressed communication data to uncompressed communication data of 150 MB inside the reading processing unit 107 takes 0.2 seconds. Thus, assuming that the processing from reading to decompressing is one processing, the amount of communication data output from the reading processing unit 107 per second is substantially 150 MB.

In this manner, high speed can be achieved from first reading of communication data by the reading processing unit 107. This makes it possible to increase the speed of second and subsequent reading of the communication data by the reading processing unit 107, independent from the capacity of a cache memory (for example, the main memory 24).

(4) Data Counting Processing

The data processing apparatus 100 (counting unit 115) counts the communication data that are read by the reading processing unit 107, in accordance with a data counting method for narrowing down candidate data for in-packet analysis.

Specifically, the data processing apparatus 100 (counting unit 115) selects one or more data counting methods by means of, for example, the method selecting unit 113 from among a plurality of data counting methods for narrowing down candidate data for in-packet analysis, and counts the communication data that are read by the reading processing unit 107, in accordance with the selected one or more data counting methods.

Figure 5:
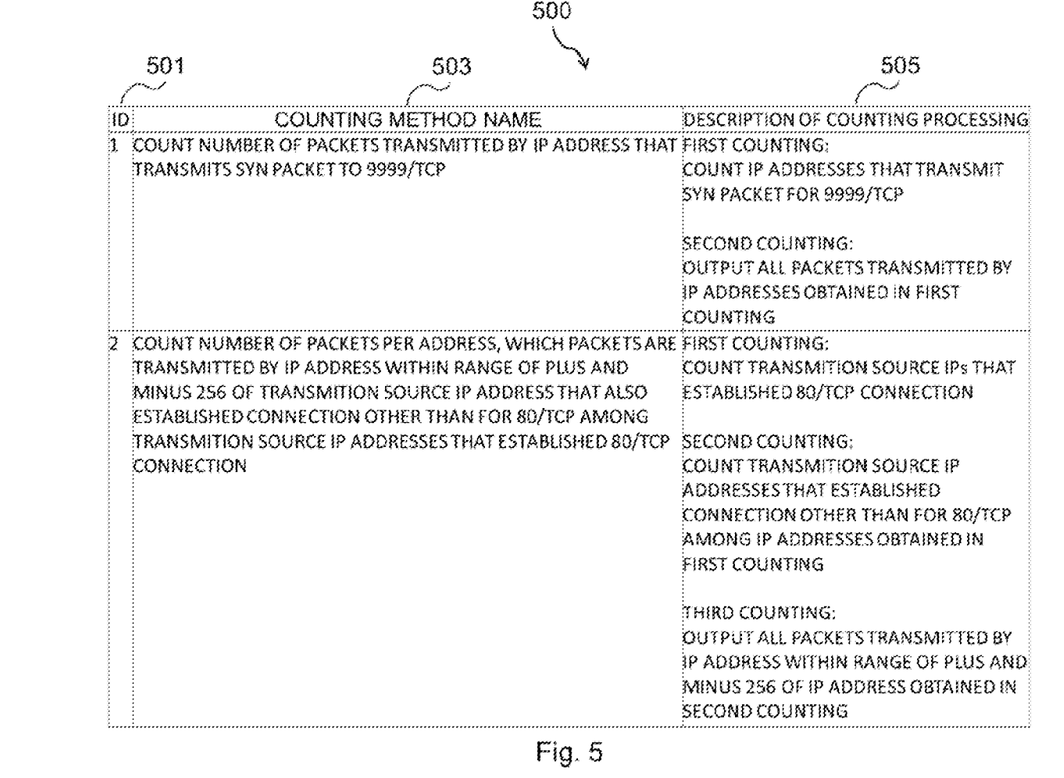
FIG. 5 is a diagram illustrating specific examples of a plurality of data counting methods managed by a data counting method table 111.

The method selecting unit 113 selects one or more data counting methods from among the plurality of data counting methods, for example, by referring to the data counting method table 111. FIG. 5 is a diagram illustrating specific examples of a plurality of data counting methods managed by the data counting method table 111.

With reference to FIG. 5, the data counting method table 111 manages an ID 501 for identifying the data counting method, a counting method name 503, and a description of counting processing 505 in association with each other.

In one example, with reference to FIG. 5, the data counting method that is identified by ID "1" is a method of counting the number of packets transmitted by an IP address that transmits a SYN packet to 9999/TCP.

The data counting method that is identified by ID "2" is, for example, a method of counting by three steps as follows. Here, in first counting, transmission source IP addresses in which 80/TCP connection is established are counted. In second counting, transmission source IP addresses in which connection other than for 80/TCP is also established are counted among the IP addresses counted in the first step. In third counting, the number of packets that are transmitted by the IP address within plus and minus 256 based on the IP addresses counted in the second step, is counted with respect to each address.

(5) Transmission of Counting Result

The data processing apparatus 100 (transmission processing unit 121) transmits to the data aggregating apparatus 200 via a communication network, information related to counting performed by the counting unit 115 as described above, in other words, information obtained by macro analysis of the communication data.

On the other hand, the data aggregating apparatus 200 receives the information related to counting, which is transmitted from the data processing apparatus 100, by means of the data receiving unit 201, stores this information related to counting, in the aggregating storage 203.

(6) Flow of Processing

Figure 6:
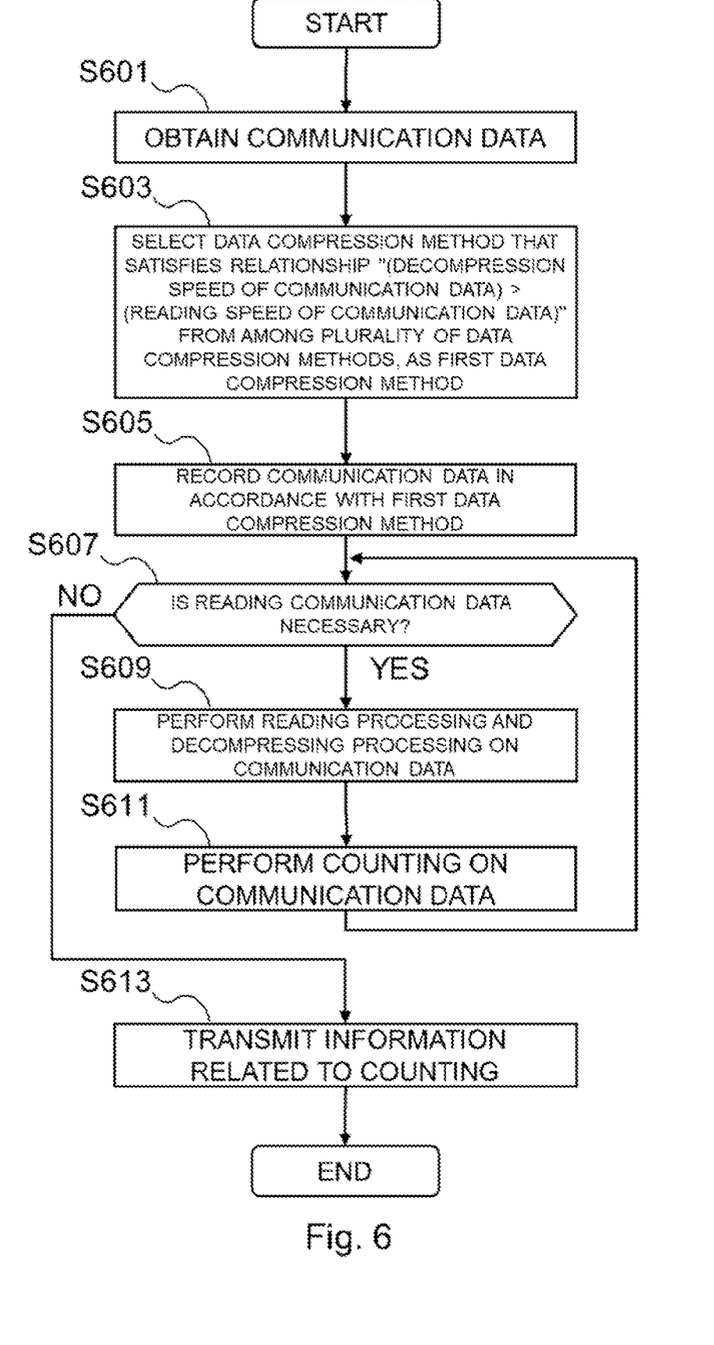
FIG. 6 is a flowchart for illustrating a flow of overall processing of the data processing apparatus 100.

Next, a flow of overall processing of the data processing apparatus 100 will be described with reference to FIG. 6. FIG. 6 is a flowchart for illustrating a flow of overall processing of the data processing apparatus 100.

With reference to FIG. 6, the data processing apparatus 100 (obtaining unit 101) obtains communication data (step S601).

Then, the data processing apparatus 100 (recording unit 103) selects a data compression method that satisfies a relationship "(decompression speed of communication data) >(reading speed of communication data)," as a first data compression method, from among a plurality of data compression methods (step S603). The data processing apparatus 100 (recording unit 103) then makes the storage 105 store the communication data in accordance with the first data compression method (step S605).

Next, the data processing apparatus 100 (reading processing unit 107) determines whether reading of the communication data from the storage 105 is necessary (step S607). If reading is necessary (step S607: YES), the data processing apparatus 100 (reading processing unit 107) performs reading processing and decompressing processing on the communication data (step S609). Subsequently, the data processing apparatus 100 (counting unit 115) performs counting processing on the communication data (step S611) and then returns to step S607.

On the other hand, if reading the communication data is not necessary in step S607 (S607: NO), the data processing apparatus 100 (transmission processing unit 121) transmits to the data aggregating apparatus 200, information related to counting in step S611 (step S613). Thereafter, the processing illustrated in FIG. 6 is terminated.

In the processing illustrated in FIG. 6, the reading processing unit 107 reads the communication data stored in the storage 105 and decompresses the communication data sequentially, whereby the counting unit 115 smoothly performs the counting processing.

4. Second Example Embodiment

A description will be given of a second example embodiment using the present invention with reference to FIGS. 7 and 8.

4.1. Configuration of Data Processing Apparatus 100

A data processing apparatus 100 includes a communication interface 21, an operation input unit 22, an arithmetic processing unit 23, a main memory 24, a storage unit 25, and a display apparatus 26, for example, as in the case of the above-described data processing apparatus 100 according to the first example embodiment illustrated in FIG. 2. Each component is similar to that of the above-described hardware configuration of the data processing apparatus 100 illustrated in FIG. 2, and therefore, description thereof is omitted.

Figure 7:
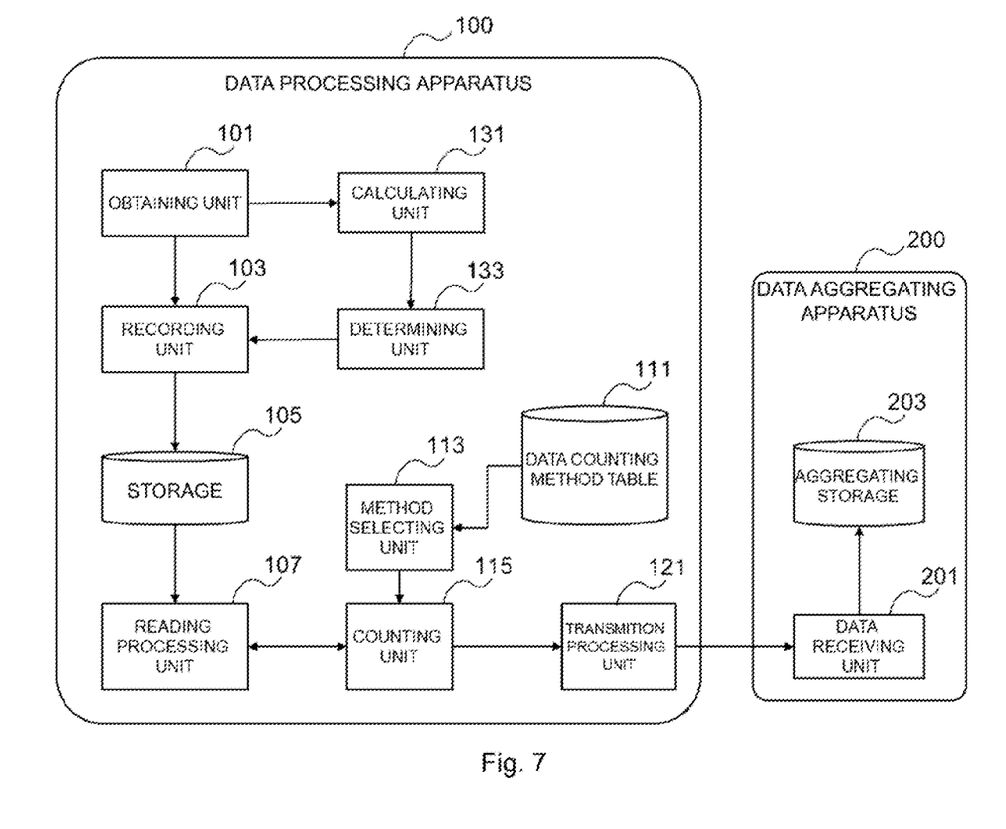
FIG. 7 is a block diagram illustrating an example of a functional configuration implemented by a data processing apparatus 100 according to a second example embodiment.

FIG. 7 is a block diagram illustrating an example of a functional configuration implemented by the data processing apparatus 100 according to the second example embodiment.

With reference to FIG. 7, the data processing apparatus 100 according to the second example embodiment includes an obtaining unit 101, a recording unit 103, a storage 105, a reading processing unit 107, a data counting method table 111, a method selecting unit 113, a counting unit 115, and a transmission processing unit 121, as in the case of the above-described data processing apparatus 100 according to the first example embodiment. The data processing apparatus 100 according to the second example embodiment also includes a calculating unit 131 and a determining unit 133. Specific operation or processing of each of these functional units will be described later.

4.2. Operation Example

Next, an example of operation of the second example embodiment will be described.

In the second example embodiment, as in the first example embodiment described above, the data processing apparatus 100 (obtaining unit 101) obtains communication data including one or more packets continuously communicated via a communication network. The data processing apparatus 100 (recording unit 103) records the communication data in the storage 105. The data processing apparatus 100 (reading processing unit 107) reads the communication data from the storage 105.

Moreover, in the second example embodiment, the data processing apparatus 100 (calculation unit 131) calculates a redundancy degree of the communication data based on entropy of the communication data.

Specifically, the redundancy degree of the communication data is calculated by the following formula.

$$1-(\text{entropy of information source})/(\text{maximum entropy})$$

Here, the entropy of information source is the entropy of data having a predetermined bit length. In addition, the maximum entropy is the entropy of data that data having the predetermined bit length can have in the most random state.

The data processing apparatus 100 (determining unit 133) determines recording the communication data in the storage 105 in accordance with a non-compressing data recording method, in the case in which the redundancy degree of the communication data is smaller than a predetermined threshold value.

In this case, the data processing apparatus 100 (recording unit 103) records the communication data in the storage 105 in accordance with the non-compressing data recording method. The data processing apparatus 100 (reading processing unit 107) then reads the communication data from the storage 105 and outputs the read communication data to the counting unit 115 without performing decompression processing.

In this manner, in the second example embodiment, communication data having such a small redundancy degree that the compressing processing takes a long time due to its low compression rate, can be recorded in the storage 105 based on the non-compressing data recording method.

The data processing apparatus 100 (recording unit 103) records flag information indicating non-compression in the storage 105 in the case of recording the communication data based on the non-compressing data recording method. This enables the reading processing unit 107 to determine whether the communication data read from the storage 105 needs decompressing processing, based on the flag information.

Next, a flow of overall processing of the data processing apparatus 100 according to the second example embodiment will be described with reference to FIG. 8. FIG. 8 is a flowchart for illustrating a flow of overall processing of the data processing apparatus 100 according to the second example embodiment.

Figure 8:
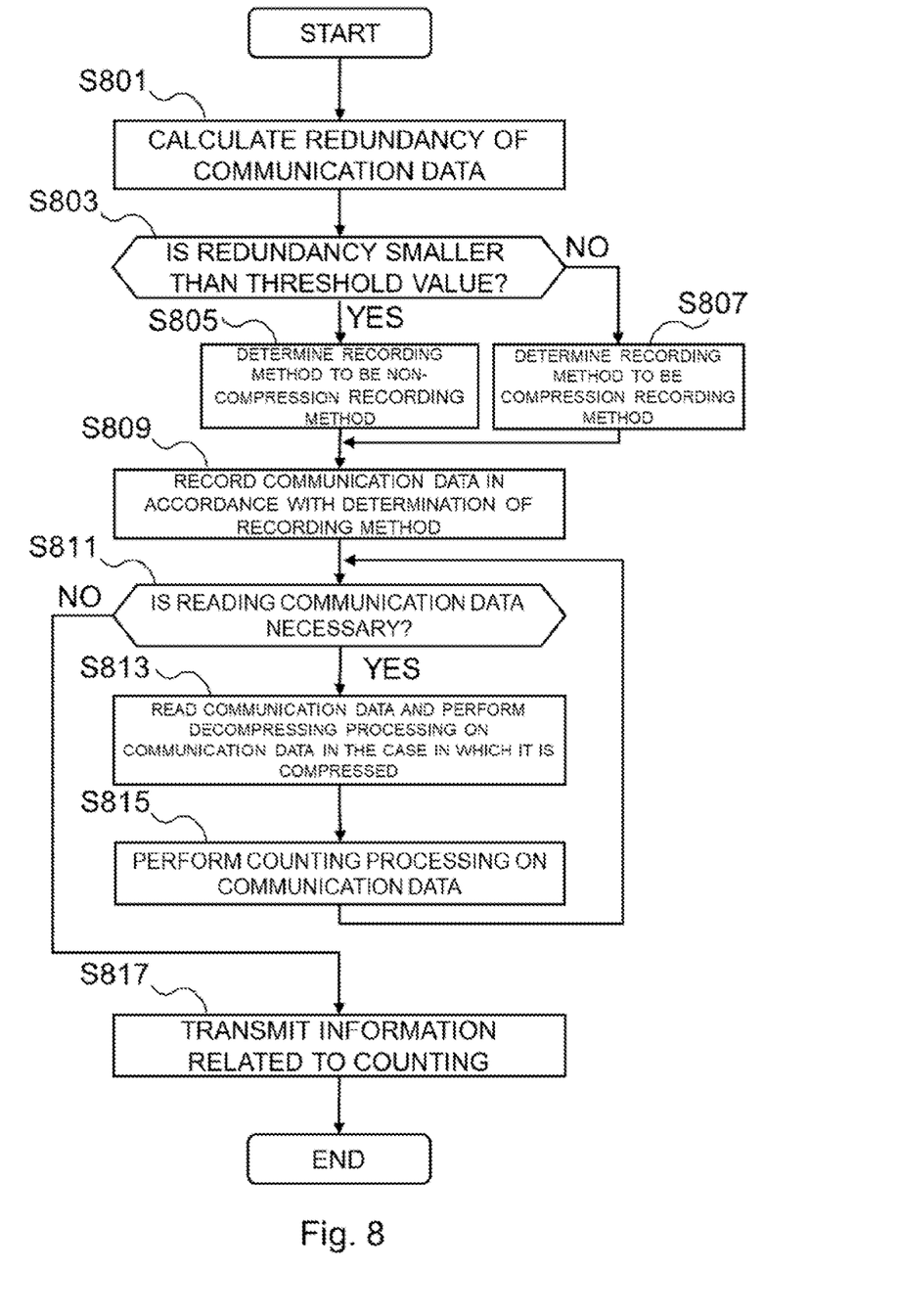
FIG. 8 is a flowchart for illustrating a flow of overall processing of the data processing apparatus 100 according to the second example embodiment.

With reference to FIG. 8, the data processing apparatus 100 (calculation unit 131) calculates a redundancy degree of the communication data based on the entropy of the communication data that is obtained by the obtaining unit 101 (step S801).

Next, the data processing apparatus 100 (determining unit 133) determines whether the redundancy degree of the communication data is smaller than a threshold value (step S803). If the redundancy degree is smaller than the threshold value (S803: YES), the data processing apparatus 100 (determining unit 133) determines the recording method to be the non-compressing data recording method (step S805). Otherwise (S803: NO), the data processing apparatus 100 (determining unit 133) determines the recording method to be the compressing data recording method (step S807).

Next, the data processing apparatus 100 (recording unit 103) records the communication data in accordance with the recording method determined in step S807 (step S809). Specifically, in a case that the recording method is determined to be the non-compressing data recording method, the data processing apparatus 100 (recording unit 103) records the communication data in the storage 105 based on the non-compressing data recording method. On the other hand, in a case that the recording method is determined to be the compressing data recording method, the data processing apparatus 100 (recording unit 103) records the communication data in the storage 105 based on the first data compression method.

Next, the data processing apparatus 100 (reading processing unit 107) determines whether reading of the communication data from the storage 105 is necessary (step S811). If reading is necessary (step S811: YES), the data processing apparatus 100 (reading processing unit 107) reads the communication data and performs decompressing processing on the communication data in a case in which the communication data is compressed (step S813). Subsequently, the data processing apparatus 100 (counting unit 115) performs counting processing on the communication data (step S815) and then returns to step S811.

On the other hand, if reading the communication data is not necessary in step S811 (S811: NO), the data processing apparatus 100 (transmission processing unit 121) transmits to the data aggregating apparatus 200, information related to counting in step S815 (step S817).

In the processing illustrated in FIG. 8, communication data can be recorded in the storage 105 based on an appropriate data recording method, in accordance with calculation result of entropy of the communication data.

5. Third Example Embodiment

Next, a description will be given of a third example embodiment of the present invention with reference to FIG. 9. The above-described first and second example embodiments are concrete example embodiments, whereas the third example embodiment is a more generalized example embodiment.

5.1. Configuration of Data Processing Apparatus 100

Figure 9:
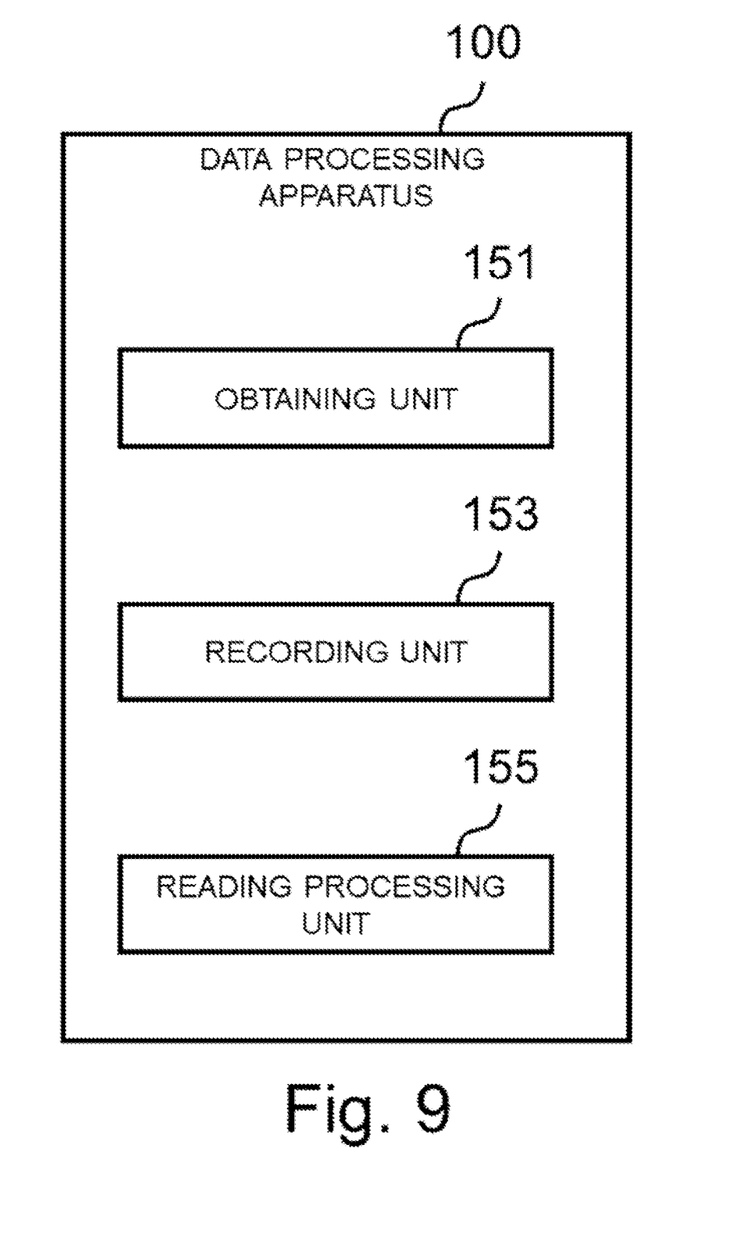
FIG. 9 is a block diagram illustrating an example of a schematic configuration of a data processing apparatus 100 according to a third example embodiment.

FIG. 9 is a block diagram illustrating an example of a schematic configuration of the data processing apparatus 100 according to the third example embodiment. With reference to FIG. 9, the data processing apparatus 100 includes an obtaining unit 151, a recording unit 153, and a reading processing unit 155.

The obtaining unit 151, the recording unit 153, and the reading processing unit 155 may be implemented with one or more processors, and a memory (e.g., a nonvolatile memory and/or a volatile memory) and/or a hard disk. The obtaining unit 151, the recording unit 153, and the reading processing unit 155 may be implemented with the same processor or may be implemented with different separate processors. The memory may be included in the one or more processors or may be provided outside the one or more processors.

5.2. Operation Example

An example of operation according to the third example embodiment will be described.

In the third example embodiment, the data processing apparatus 100 (obtaining unit 151) obtains communication data including one or more packets continuously communicated via a communication network. The data processing apparatus 100 (recording unit 153) records the communication data in the recording apparatus. The data processing apparatus 100 (reading processing unit 155) reads the communication data from the recording apparatus.

Here, the data processing apparatus 100 (recording unit 153) selects a first data compression method from among a plurality of data compression methods based on compression rate for each data compression method, reading speed of the communication data from the storage apparatus to the reading processing unit 155, and decompression speed of the communication data required from reading of the communication data to decompression of the communication data in accordance with each compression method by the reading processing unit 155, and records the communication data in accordance with the first data compression method.

Relationship with First Example Embodiment

In one example, the obtaining unit 151, the recording unit 153, and the reading processing unit 155 of the third example embodiment may perform the operations of the obtaining unit 101, the recording unit 103, and the reading processing unit 107 of the first or second example embodiment, respectively. In this case, the descriptions of the first or second example embodiment may be applicable to the third example embodiment.

Note that the third example embodiment is not limited to this example.

The third example embodiment has been described above. The third example embodiment enables, for example, recording communication data via a communication network, in a storage apparatus in accordance with an appropriate data recording method.

6. Other Example Embodiments

Descriptions have been given above of the example embodiments of the present invention. However, the present invention is not limited to these example embodiments. It should be understood by those of ordinary skill in the art that these example embodiments are merely examples and that various alterations are possible without departing from the scope and the spirit of the present invention.

For example, the steps in the processing described in the Specification may not necessarily be executed in time series in the order described in the corresponding sequence diagram. For example, the steps in the processing may be executed in an order different from that described in the corresponding sequence diagram or may be executed in parallel. Some of the steps in the processing may be deleted, or more steps may be added to the processing.

An apparatus including constituent elements (e.g., the obtaining unit, the recording unit, and/or the reading processing unit) of the data processing apparatus described in the Specification (e.g., one or more apparatuses (or units) among a plurality of apparatuses (or units) constituting the data processing apparatus or a module for one of the plurality of apparatuses (or units)) may be provided. Moreover, methods including processing of the constituent elements may be provided, and programs for causing a processor to execute processing of the constituent elements may be provided. Moreover, non-transitory computer readable recording media (non-transitory computer readable media) having recorded thereon the programs may be provided. It is apparent that such apparatuses, modules, methods, programs, and non-transitory computer readable recording media are also included in the present invention.

The whole or part of the example embodiments disclosed above can be described as, but not limited to, the following supplementary notes.

(Supplementary Note 1)

A data processing apparatus comprising:
an obtaining unit configured to obtain communication data including one or more packets continuously communicated via a communication network;
a recording unit configured to record the communication data in a storage apparatus; and
a reading processing unit configured to read the communication data from the storage apparatus, wherein
the recording unit is configured to
select a first data compression method from among a plurality of data compression methods based on compression rate for each data compression method, reading speed of the communication data from the storage apparatus to the reading processing unit, and decompression speed of the communication data required from reading of the communication data by the reading processing unit to decompression of the communication data in accordance with each compression method, and
record the communication data in accordance with the first data compression method.

(Supplementary Note 2)

The data processing apparatus according to supplementary note 1, wherein the first data compression method is a data compression method that satisfies a condition that the decompression speed of the communication data is higher than the reading speed of the communication data.

(Supplementary Note 3)

The data processing apparatus according to supplementary note 1 or 2, wherein the recording unit is configured to record the communication data in the storage apparatus without configuring index information that indicates a correspondence relationship between each data element contained in the communication data and a recording location in the storage apparatus.

(Supplementary Note 4)

The data processing apparatus according to any one of supplementary notes 1 to 3, further comprising a counting unit configured to count the communication data that are read by the reading processing unit, in accordance with a data counting method for narrowing down candidate data for in-packet analysis.

(Supplementary Note 5)

The data processing apparatus according to supplementary note 4, wherein the counting unit is configured to
select one or more data counting methods from among a plurality of the data counting methods for narrowing down candidate data for in-packet analysis, and
count the communication data that are read by the reading processing unit, in accordance with the selected one or more data counting methods.

(Supplementary Note 6)

The data processing apparatus according to supplementary note 4 or 5, further comprising a transmission processing unit configured to transmit information related to the counting via a communication network.

(Supplementary Note 7)

The data processing apparatus according to any one of supplementary notes 1 to 6, wherein the communication data is PCAP data containing a Packet Capture (PCAP) header and a PCAP payload.

(Supplementary Note 8)

The data processing apparatus according to any one of supplementary notes 1 to 7, wherein the obtaining unit is configured to access the communication network to receive the communication data via the communication network.

(Supplementary Note 9)

The data processing apparatus according to any one of supplementary notes 1 to 8, further comprising:
a calculation unit configured to calculate a redundancy degree of the communication data based on entropy of the communication data; and
a determining unit configured to, in a case in which the redundancy degree of the communication data is smaller than a threshold value, determine that the communication data is to be recorded in the storage apparatus in accordance with a non-compressing data recording method.

(Supplementary Note 10)

A data processing method comprising:

obtaining communication data including one or more packets continuously communicated via a communication network;

recording the communication data in a storage apparatus; and reading the communication data from the storage apparatus, wherein the recording of the communication data in the storage apparatus includes:

selecting a first data compression method from among a plurality of data compression methods based on compression rate for each data compression method, reading speed of the communication data from the storage apparatus, and decompression speed of the communication data required from reading of the communication data to decompression of the communication data in accordance with each compression method, and recording the communication data in accordance with the first data compression method.

(Supplementary Note 11)

A program causing a processor to execute processing including:

obtaining communication data including one or more packets continuously communicated via a communication network;

recording the communication data in a storage apparatus; and reading the communication data from the storage apparatus, wherein the recording of the communication data in the storage apparatus includes:

selecting a first data compression method from among a plurality of data compression methods based on compression rate for each data compression method, reading speed of the communication data from the storage apparatus, and decompression speed of the communication data required from reading of the communication data to decompression of the communication data in accordance with each compression method, and recording the communication data in accordance with the first data compression method.

This application claims priority based on JP 2019-203032 filed on Nov. 8, 2019, the entire disclosure of which is incorporated herein.

INDUSTRIAL APPLICABILITY

It is possible to record communication data via a communication network, in a storage apparatus in accordance with an appropriate data recording method.

REFERENCE SIGNS LIST

1 System
100 Data Processing Apparatus
101, 151 Obtaining Unit
103, 153 Recording Unit
105 Storage
107, 155 Reading Processing Unit
200 Data Aggregating Apparatus

What is claimed is:

1. A data processing apparatus comprising:
a memory storing instructions; and
one or more processors configured to execute the instructions to:
obtain communication data including one or more packets continuously communicated via a communication network;
select a first data compression method from among a plurality of data compression methods based on a compression rate for each data compression method, a reading speed of the communication data from a storage apparatus, and a decompression speed of the communication data required from reading of the communication data to decompression of the communication data in accordance with each compression method;
record the communication data in the storage apparatus in accordance with the first data compression method;
read the communication data from the storage apparatus; and
count the communication data that are read, in accordance with a data counting method for narrowing down candidate data for in-packet analysis.

2. The data processing apparatus according to claim 1, wherein the first data compression method satisfies a condition that the decompression speed of the communication data is higher than the reading speed of the communication data.

3. The data processing apparatus according to claim 1, wherein the one or more processors are configured to execute the instructions to record the communication data in the storage apparatus without configuring index information that indicates a correspondence relationship between each data element contained in the communication data and a recording location in the storage apparatus.

4. The data processing apparatus according to claim 1, wherein the one or more processors are configured to execute the instructions to
select the data counting method in accordance with which the communication data that are read are to be counted, from among a plurality of the data counting methods for narrowing down candidate data for in-packet analysis.

5. The data processing apparatus according to claim 1, wherein the one or more processors are configured to execute the instructions to transmit information related to the counting via a communication network.

6. The data processing apparatus according to claim 1, wherein the communication data is PCAP data containing a Packet Capture (PCAP) header and a PCAP payload.

7. The data processing apparatus according to claim 1, wherein the one or more processors are configured to execute the instructions to access the communication network to receive the communication data via the communication network.

8. The data processing apparatus according to claim 1, wherein the one or more processors are configured to execute the instructions to:
calculate a redundancy degree of the communication data based on entropy of the communication data; and
in a case in which the redundancy degree of the communication data is smaller than a threshold value, determine that the communication data is to be recorded in the storage apparatus in accordance with a non-compressing data recording method.

9. A data processing method performed by a data processing apparatus and comprising:
> obtaining communication data including one or more packets continuously communicated via a communication network;
>> selecting a first data compression method from among a plurality of data compression methods based on a compression rate for each data compression method, a reading speed of the communication data from a storage apparatus, and a decompression speed of the communication data required from reading of the communication data to decompression of the communication data in accordance with each compression method;
>> recording the communication data in the storage apparatus in accordance with the first data compression method;
> reading the communication data from the storage apparatus; and
> counting the communication data that are read, in accordance with a data counting method for narrowing down candidate data for in-packet analysis.

10. A non-transitory computer readable recording medium storing a program executable by a processor to perform processing comprising:
> obtaining communication data including one or more packets continuously communicated via a communication network;
>> selecting a first data compression method from among a plurality of data compression methods based on a compression rate for each data compression method, a reading speed of the communication data from a storage apparatus, and a decompression speed of the communication data required from reading of the communication data to decompression of the communication data in accordance with each compression method;
>> recording the communication data in the storage apparatus in accordance with the first data compression method;
> reading the communication data from the storage apparatus; and
> counting the communication data that are read, in accordance with a data counting method for narrowing down candidate data for in-packet analysis.

* * * * *